(12) United States Patent
Zhan et al.

(10) Patent No.: US 10,349,187 B2
(45) Date of Patent: Jul. 9, 2019

(54) ACOUSTIC SENSOR INTEGRATED MEMS MICROPHONE STRUCTURE AND FABRICATION METHOD THEREOF

(71) Applicant: Goertek Inc., Shandong (CN)

(72) Inventors: Junkai Zhan, Shandong (CN);
Mengjin Cai, Shandong (CN);
Guanxun Qiu, Shandong (CN);
Zonglin Zhou, Shandong (CN);
Qinglin Song, Shandong (CN)

(73) Assignee: Goertek Inc., Shandong (CN)

( * ) Notice: Subject to any disclaimer, the term of this patent is extended or adjusted under 35 U.S.C. 154(b) by 0 days.

(21) Appl. No.: 15/781,364

(22) PCT Filed: Dec. 14, 2015

(86) PCT No.: PCT/CN2015/097310
§ 371 (c)(1),
(2) Date: Jun. 4, 2018

(87) PCT Pub. No.: WO2017/092074
PCT Pub. Date: Jun. 8, 2017

(65) Prior Publication Data
US 2018/0359571 A1 Dec. 13, 2018

(30) Foreign Application Priority Data
Dec. 4, 2015 (CN) .......................... 2015 1 0891760

(51) Int. Cl.
*H04R 19/00* (2006.01)
*H04R 19/04* (2006.01)
(Continued)

(52) U.S. Cl.
CPC ........... *H04R 19/04* (2013.01); *B81B 7/0029* (2013.01); *B81B 7/02* (2013.01); *B81C 1/00158* (2013.01);
(Continued)

(58) Field of Classification Search
CPC .............. H04R 19/04; H04R 2201/003; H04R 2201/005; H04R 31/00; B81B 2201/0257;
(Continued)

(56) References Cited

U.S. PATENT DOCUMENTS 6,388,300 B1    5/2002  Kano et al.
9,187,317 B2 *  11/2015 Cheng ................. B81C 1/00309
(Continued)

FOREIGN PATENT DOCUMENTS

CN        101339202 A    1/2009
CN        101792110 A    8/2010
(Continued)

OTHER PUBLICATIONS

International Searching Authority, International Search Report (ISR) and Written Opinion for International Application No. PCT/CN2015/097310, dated Aug. 31, 2016, 11 pages, State Intellectual Property Office of the P.R.C., China.
(Continued)

*Primary Examiner* — Matthew A Eason
(74) *Attorney, Agent, or Firm* — Alston & Bird LLP (57) ABSTRACT

An acoustic sensor integrated MEMS microphone structure and a fabrication method thereof. A diaphragm (3e) and back-pole (7) which forms a condenser structure are formed on a substrate (1) having at least one recessed slot (1a) on the top. A sensitive electrode is formed on the substrate (1), the sensitive electrode comprising a fixed portion (3b) fixed on the substrate (1) via a sacrificial layer (2), and a bending portion (3a) inserted into the recessed slot (1a), wherein the bending portion and the side wall of the recessed slot form the condenser structure. The integrated structure integrates the condenser structure of the microphone and condenser structure of the acoustic sensor on a substrate (1), thereby increasing the integration level thereof and reducing the (Continued)

overall size of the package. Meanwhile, the microphone diaphragm (3e) and the sensitive electrode of the acoustic sensor can be fabricated on a same substrate (1) at the same time, from the same material, and using the same fabricating process to increase production efficiency.

10 Claims, 4 Drawing Sheets (51) Int. Cl.
*H04R 31/00* (2006.01)
*B81B 7/00* (2006.01)
*B81C 1/00* (2006.01)
*B81B 7/02* (2006.01)

(52) U.S. Cl.
CPC ........... *H04R 19/005* (2013.01); *H04R 31/00* (2013.01); *B81B 2201/0257* (2013.01); *B81B 2201/0292* (2013.01); *H04R 2201/003* (2013.01)

(58) Field of Classification Search
CPC .............. B81B 2201/0264; B81B 7/02; B81C 1/00214
See application file for complete search history.

(56) References Cited

U.S. PATENT DOCUMENTS

| | | | | |
|---|---|---|---|---|
| 9,516,423 | B2* | 12/2016 | Daley | ................. B81B 3/007 |
| 9,809,448 | B2* | 11/2017 | Lim | ..................... B81B 7/02 |
| 2007/0215962 | A1 | 9/2007 | Minervini et al. | |
| 2009/0008728 | A1 | 1/2009 | Fujii et al. | |
| 2010/0194407 | A1 | 8/2010 | Nakatani | |
| 2012/0032346 | A1 | 2/2012 | Najafi et al. | |
| 2013/0202136 | A1 | 8/2013 | Hu et al. | |
| 2014/0112510 | A1* | 4/2014 | Yang | .................. H04R 1/021 |
| | | | | 381/332 |
| 2014/0264653 | A1* | 9/2014 | Cheng | ............... B81C 1/00238 |
| | | | | 257/416 |
| 2014/0264662 | A1 | 9/2014 | Cheng et al. | |
| 2014/0332909 | A1 | 11/2014 | Li et al. | |
| 2015/0078590 | A1 | 3/2015 | Daley et al. | |
| 2015/0102437 | A1* | 4/2015 | Liu | ..................... B81B 3/0021 |
| | | | | 257/419 |
| 2015/0256917 | A1* | 9/2015 | Schelling | ................. H04R 1/08 |
| | | | | 381/111 |
| 2015/0321906 | A1* | 11/2015 | Tsai | ..................... B81C 1/0023 |
| | | | | 257/416 |
| 2016/0165330 | A1* | 6/2016 | Minervini | .............. G01K 13/00 |
| | | | | 374/142 |
| 2016/0167953 | A1* | 6/2016 | Gogoi | .................... H01L 27/14 |
| 2016/0221822 | A1* | 8/2016 | Krumbein | ............. H04R 23/00 |
| 2016/0277844 | A1* | 9/2016 | Kopetz | .................... H04R 3/00 |
| 2016/0304336 | A1* | 10/2016 | Schoen | ............. B81C 1/00214 |
| 2017/0164118 | A1* | 6/2017 | Wiesbauer | ............... H04R 1/04 |
| 2017/0230758 | A1* | 8/2017 | Kuntzman | ............ H04R 19/04 |
| 2017/0334714 | A1* | 11/2017 | Gao | ........................ B81B 7/02 |
| 2017/0347174 | A1* | 11/2017 | Chandrasekaran | ....... B81B 7/02 |
| 2018/0050902 | A1* | 2/2018 | Sun | ........................ H04R 19/04 |
| 2018/0317022 | A1* | 11/2018 | Evans | .................... H04R 19/04 |
| 2018/0356255 | A1* | 12/2018 | Zhan | .................... G01D 5/2417 |

FOREIGN PATENT DOCUMENTS

| | | |
|---|---|---|
| CN | 103248994 A | 8/2013 |
| CN | 104045052 A | 9/2014 |
| CN | 104140072 A | 11/2014 |
| CN | 104203806 A | 12/2014 |
| CN | 104555896 A | 4/2015 |
| CN | 104883652 A | 9/2015 |
| CN | 205179361 U | 4/2016 |

OTHER PUBLICATIONS

International Searching Authority, Written Opinion for International Application No. PCT/CN2015/097310, dated Aug. 31, 2016, 6 pages, State Intellectual Property Office of the P.R.C., China.

The State Intellectual Property Office of the P.R.C., First Office Action, including Search Report, for Application No. 201510891760.0, dated Nov. 27, 2017, 9 pages, China.

The State Intellectual Property Office of the P.R.C., Notification to Grant Patent Right for Application No. 201510891760.0, dated Dec. 29, 2017, 3 pages, China.

* cited by examiner

ACOUSTIC SENSOR INTEGRATED MEMS MICROPHONE STRUCTURE AND FABRICATION METHOD THEREOF

CROSS-REFERENCE TO RELATED APPLICATIONS

This application is a National Stage of International Application No. PCT/CN2015/097310, filed on Dec. 14, 2015, which claims priority to Chinese Patent Application No. 201510891760.0, filed on Dec. 4, 2015, both of which are hereby incorporated by reference in their entireties.

BACKGROUND

Technical Field

The present invention relates to the field of sensors, and more particularly, to an integrated structure of an MEMS microphone and an environmental sensor; and the invention further relates to a manufacturing method for an integrated structure of an MEMS microphone and an environmental sensor.

Related Art

In recent years, with the development of science and technology, the sizes of electronic products such as mobile phones and laptops are continuously reduced. Besides, the requirements of people on the performance of these portable electronic products are also higher and higher, which requires that the sizes of matched electronic parts must be reduced accordingly.

As a measuring device, a sensor has been popularly applied to electronic products such as mobile phones and laptops. In the existing technological structures, due to different detection principles, an MEMS microphone chip and an MEMS environment sensor chip are generally separated from each other. The MEMS microphone needs a closed space to protect its fine structure, while the sensitive structure of the MEMS environment sensor needs to make contact with the outside world. The two devices are designed and processed based on different process platforms, and form independent chips by using different package types. When assembling, the system manufacturer mounts the MEMS microphone chip and the MEMS environmental sensor chip on the same motherboard by means of SMT, thereby increasing the chip cost and also increasing the packaging cost.

In the existing environmental sensor structures, two conductive film layers are deposited on the surface of a base material in the manner of semiconductor processing generally. These two conductive film layers form a parallel capacitor structure. When the outside environment is changed, the distance or opposite areas between the two conductive film layers are changed. Therefore, the parallel capacitor structure can output a corresponding electrical detection signal. The capacitor structure in parallel arrangement occupies a larger space, which does not conform to the modern development requirements.

BRIEF SUMMARY

An objective of the present invention is to provide a novel technical solution of an integrated structure of an MEMS microphone and an environmental sensor.

According to the first aspect of the present invention, there is provided an integrated structure of an MEMS microphone and an environmental sensor, which includes a base material.

The base material is provided with a vibrating diaphragm and a back electrode which form a capacitor structure of the MEMS microphone, and a back cavity is provided at a position of the base material below the vibrating diaphragm and the back electrode.

The upper end of the base material is further provided with at least one groove; the integrated structure further includes a sensitive electrode on the base material, the sensitive electrode includes a fixed part fixed on the end surface of the base material through a first sacrificial layer, and a bending part extending into the groove; the bending part and the side wall of the groove form a capacitor structure of the MEMS environment sensor; wherein the bending part, the fixed part and the groove form an airtight cavity.

Preferably, the bending part is suspended in the groove.

Preferably, the bottom end of the bending part is fixed to the bottom end of the groove through the sacrificial layer.

Preferably, the sensitive electrode further includes a connecting part connected to two adjacent bending parts, and the connecting part is suspended above the end surface of the base material.

Preferably, the connecting part is further provided with a hollow, the two adjacent bending parts are insulated by the hollow; and the environmental sensor further includes a second sacrificial layer filling the hollow.

The invention also provides a manufacturing method for an integrated structure of a MEMS microphone and an environmental sensor, which includes the following steps:

a) etching a groove in the upper end surface of the base material, and sequentially depositing a first sacrificial layer and a first film layer on the upper end surface of the base material and the inner wall of the groove, wherein the first film layer includes a fixed part fixed on the end surface of the base material, and a bending part extending into the groove;

b) etching the first film layer located in the vicinity of the groove to form a hollow, and at least corroding the first sacrificial layer located between the bending part and the side wall of the groove through the hollow;

c) etching the first film layer on the end surface of the base material to form a vibrating diaphragm of the MEMS microphone;

d) depositing a second sacrificial layer on the whole first film layer, wherein the second sacrificial layer seals the hollow;

e) depositing a second film layer on the second sacrificial layer, and etching the second film layer to form a back electrode of the MEMS microphone;

f) etching the base material to form a back cavity of the MEMS microphone; and g) corroding the first sacrificial layer and the second sacrificial layer through the back cavity to release the vibrating diaphragm; and corroding the second sacrificial layer on the bending part to expose the bending part.

Preferably, in the step b), the first sacrificial layer between the bending part and the groove is completely corroded, so that the bending part is suspended in the groove.

Preferably, in the step d), the manufacturing method further includes the following step: etching the positions on the second sacrificial layer on both sides of the hollow to form a side wall groove, and depositing a protective layer on the upper end of the second sacrificial layer, wherein the protective layer is filled in the side wall groove.

Preferably, between the step e) and the step f), the manufacturing method further includes a step of etching the second film layer on the bending part, and a step of etching the back electrode to form an airflow communication hole.

Preferably, in the step f), the manufacturing method further includes a step of depositing a metal electrode on the back electrode, the base material, the vibrating diaphragm and the bending part.

According to the integrated structure of the present invention, the capacitor structure of the MEMS microphone and that of the environmental sensor are integrated on the base material, and therefore the degree of integration of the MEMS microphone and the environmental sensor is improved, which may greatly reduce the size of the whole package structure. Meanwhile, the vibrating diaphragm of the MEMS microphone and the sensitive electrode of the environmental sensor may be made with the same material and fabrication process, so that the MEMS microphone and the environmental sensor may be simultaneously fabricated on a shared base material, which improves the production efficiency.

According to the MEMS environmental sensor in the integrated structure of the present invention, the capacitor structure traditionally disposed on the surface of the base material is changed into the capacitor structure vertically extending into the base material. The sensing area between two electrode plates of the capacitor can be increased by increasing the depth of the groove. Therefore, the covering area of the capacitor on the base material can be greatly reduced. The coverage area of the environmental sensor of the present invention can be reduced to ⅕-1/10 of the coverage area of the traditional sensor, or smaller, which meets the development trend of becoming lighter and thinner of modern electronic devices.

The inventors of the present invention have found that in the prior art, the MEMS microphone and the MEMS environmental sensor are designed and processed based on different process platforms, and form independent chips by using different package types, which increases the chip cost and also increases the packaging cost. Therefore, the technical task to be achieved by the present invention or the technical problem to be solved by the present invention is not conceived or anticipated by those skilled in the art, and accordingly, the present invention is a novel technical solution.

Other features and advantages of the present invention will become apparent through the detailed descriptions of the exemplary embodiments of the present invention with reference to the drawings.

BRIEF DESCRIPTION OF THE FIGURES

The drawings that constitute a part of the description show the embodiments of the present invention and are intended to explain the principle of the present invention together with the descriptions thereof.

DETAILED DESCRIPTION OF VARIOUS EMBODIMENTS

Now, various exemplary embodiments of the present invention will be described in detail with reference to the drawings. It should be noted that, unless specified otherwise, the relative arrangements of the members and steps, the mathematical formulas and numerical values described in these embodiments do not restrict the scope of the present invention.

The following descriptions for at least one embodiment are actually descriptive only, and shall not be intended to limit the invention and any application or use thereof.

The techniques and devices well known to those skilled in the related arts may not be discussed in detail. However, where applicable, such techniques and devices should be deemed as a part of the description.

Any specific value shown herein and in all the examples should be interpreted as exemplary only rather than restrictive. Therefore, other examples of the exemplary embodiments may include different values.

It should be noted that similar signs and letters in the following drawings represent similar items. Therefore, once defined in one drawing, an item may not be further discussed in the followed drawings.

Figure 1:
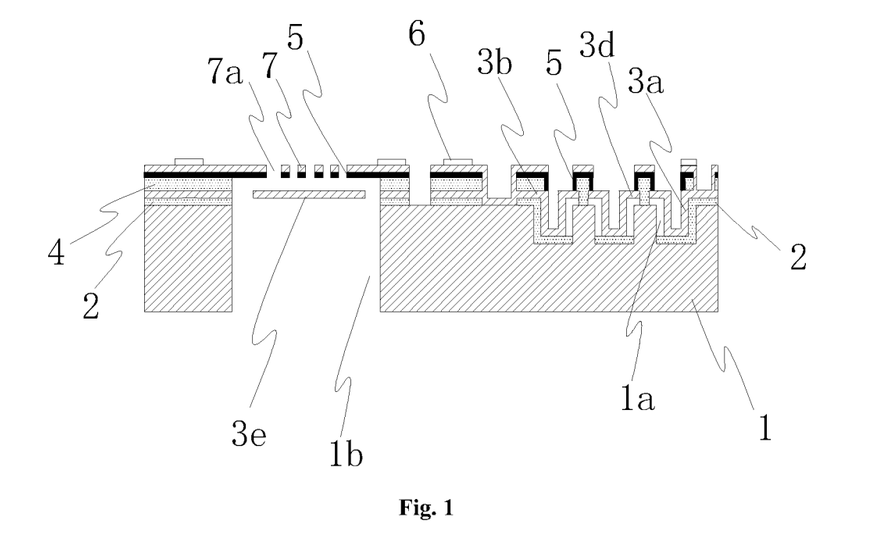
FIG. 1 is a schematic diagram of an integrated structure of the present invention.

Referring to FIG. 1, according to the integrated structure of the MEMS microphone and the environmental sensor according to the present invention, the capacitor structure of the MEMS microphone and that of the MEMS environmental sensor may be integrated on the same chip. The environmental sensor of the present invention may be a sensor for detecting the surrounding environment, such as a pressure sensor, a temperature sensor, a humidity sensor, etc., and the sensitive electrode of the environmental sensor is a sensitive film that will be deformed accordingly along with the change of the outside environment, which is the common knowledge for those skilled in the art and will not be described in detail herein.

According to the integrated structure of the present invention, at least one groove 1a is provided on the upper end surface of the base material 1, and the number of the grooves 1a may be set according to actual structural requirements. The shape of the groove 1a may be a U-shaped groove structure, or may be an arc groove structure well known to those skilled in the art, or the like. The base material 1 is provided with a sensitive electrode which forms an MEMS environmental sensor. The sensitive electrode includes a fixed part 3b fixed on the end surface of the base material 1, and a bending part 3a extending into the groove 1a. The bending part 3a and the side wall of the groove 1a form a capacitor structure for detecting the surrounding environment. Specifically, the sensitive electrode may be made of a polycrystalline silicon material, and may be provided on the base material 1 by means of deposition or the like. A first sacrificial layer 2 may be provided between the fixed part 3b and the base material 1. It should be noted here that the sacrificial layer may be made of a material well known to those skilled in the art, such as silicon oxide. The sacrificial layer may also be used as an insulating layer to ensure insulation among the parts, which is the common knowledge for those skilled in the art and will not be described in detail herein. Due to the first sacrificial layer 2, the fixed part 3b and the base material 1 are insulated from each other. Meanwhile, the first sacrificial layer 2 may support the sensitive electrode on the base material 1 to prevent the bending part 3a in the sensitive electrode 1 from making contact with the base material 1.

The shape of the bending part 3a is matched with the shape of the groove 1a. For example, when the groove 1a is a U-shaped structure, the bending part 3a may be selected to be a U-shaped groove structure, or an arc groove structure well known to those skilled in the art. The bending part 3a is smaller than the groove 1a, so that the bending part 3a may extend into the groove 1a. The bending part 3a, the fixed part 3b and the groove 1a form an airtight cavity together.

According to the integrated structure of the present invention, the base material 1 is provided with a vibrating diaphragm 3e and a back electrode 7 which constitute an MEMS microphone. The vibrating diaphragm 3e and the back electrode 7 form a plate-type capacitor structure. For those skilled in the art, the capacitor structure of the MEMS microphone may adopt a structure that the vibrating diaphragm 3e is disposed above and the back electrodes 7 is disposed below, or may adopt a structure that the vibrating diaphragm 3e is disposed below and the back electrode 7 is disposed above. In a specific embodiment of the present invention, in order to correspond to the MEMS environmental sensor, the capacitor structure of the MEMS microphone adopts a structure that the vibrating diaphragm 3e is disposed below and the back electrode 7 is disposed above. That is to say, the vibrating diaphragm 3e is disposed on the base material 1 through the first sacrificial layer 2, and the back electrode 7 is supported above the vibrating diaphragm 3e through the second sacrificial layer 4, so that a certain distance exists between the vibrating diaphragm 3e and the back electrode 7. And by means of a traditional lead, a component converting a voice signal into an electrical signal may be formed. An action principle of the capacitor structure of the MEMS microphone is the common knowledge for those skilled in the art, and will not be repeated herein.

In order to enable the capacitor structure of the MEMS microphone to play a role, a back cavity 1b is provided at a position of the base material 1 corresponding to the vibrating diaphragm 3e, so that the vibrating diaphragm 3e is suspended above the back cavity 1b. Meanwhile, a plurality of airflow communication holes is further provided on the back electrode 7 to balance airflow between a front cavity and a back cavity of the MEMS microphone.

According to the integrated structure of the present invention, the capacitor structure of the MEMS microphone and that of the environmental sensor are integrated on the base material, and therefore the degree of integration of the MEMS microphone and the environmental sensor is improved, which may greatly reduce the size of the whole package structure. Meanwhile, the vibrating diaphragm of the MEMS microphone and the sensitive electrode of the environmental sensor may be made with the same materials and fabrication processes, so that the MEMS microphone and the environmental sensor may be simultaneously fabricated on a shared base material, which improves the production efficiency.

According to the integrated structure of the present invention, the bending part 3a of the sensitive electrode and the side wall of the groove 1a form a vertical capacitor structure. When the outside environment is changed (for example, the pressure changes), the bending part 3a will be deformed accordingly, thereby changing the distance between the bending part 3a and the side wall of the groove 1a, and causing a signal output by the capacitor to be changed. The environmental sensor of the present invention may be strip-shaped, comb tooth-shaped or spiral or other shapes well known by those skilled in the art. According to the MEMS environmental sensor of the integrated structure of the present invention, the capacitor structure traditionally disposed on the surface of the base material is changed into the capacitor structure vertically extending into the base material. The sensing area between two electrode plates of the capacitor may be increased by increasing the depth of the groove. Therefore, the coverage area of the capacitor on the base material may be greatly reduced. The coverage area of the environmental sensor according to the present invention may be reduced to ⅕-1/10 of the coverage area of the traditional sensor, or smaller, which meets the development trend of becoming lighter and thinner of modern electronic devices.

In a preferred embodiment of the present invention, the bending part 3a of the sensitive electrode is suspended in the groove 1a of the base material. That is to say, there is no any connection relationship between the bending part 3a and the groove 1a. When the outside environment is changed, the bending part 3a will be deformed accordingly, thereby changing the distance between the bending part 3a and the side wall of the groove 1a, and causing the signal output by the capacitor to be changed.

In another preferred embodiment of the present invention, the bending part 3a of the sensitive electrode extends into the groove 1a of the base material, and the bottom end of the bending part 3a and the bottom end of the groove 1a are connected together by a first sacrificial layer 2. That is to say, the bottom end of the bending part 3a is fixed by the first sacrificial layer 2. When the outside environment is changed, the bottom end of the bending part 3a is fixed, thereby preventing the bending part 3a from swinging in the groove 1a. Only the side wall of the bending part 3a is deformed along with the change of the outside environment. Therefore, the distance between the bending part 3a and the side wall of the groove 1a is changed, and the signal output by the capacitor is caused to be changed.

In a preferred embodiment of the present invention, when a plurality of grooves 1a is disposed, the fixed part 3b may be disposed on the edge position of each groove 1a, and may also be disposed only on the edge of the outermost groove 1a. When the fixed part 3b is fixed together with the edge of the outermost groove 1a, the sensitive electrode further includes a connecting part 3d connected to two adjacent bending parts 3a, referring to FIG. 1. The connecting part 3d is preferably suspended above the end surface of the base material. At this point, the bending parts 3a and the connecting parts 3d make no contact with the base material 1, that is to say, the bending parts 3a and the connecting parts 3d are all in the suspending state. Therefore, the sensitivity of the bending parts 3a is improved, and a finally detected result becomes more precise.

Figure 3:
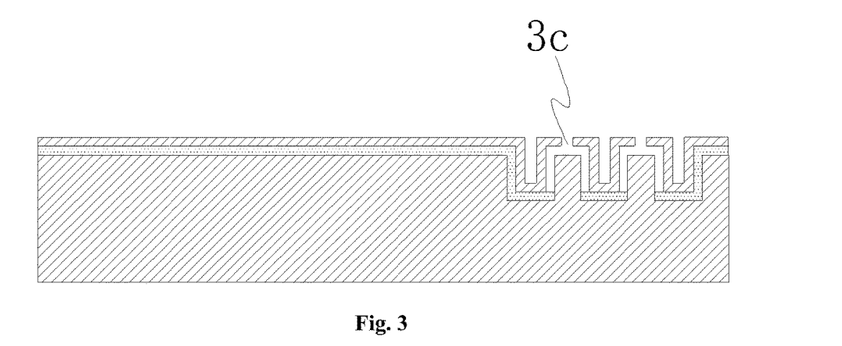

According to the environmental sensor of the present invention, a plurality of groups of capacitor structures may be disposed according to actual needs, and it is required to dispose hollows 3c on some connecting parts 3d, referring to FIG. 3. The two adjacent bending parts 3a are insulated by the hollow 3c. Meanwhile, in order to ensure that the environmental sensor has the airtight cavity, the hollows 3c are required to be filled with a second sacrificial layer 4. It is further preferable in the present invention that, a protective layer 5 may be provided on the upper end of the second sacrificial layer, water or mist may be prevented from entering the interior of the environmental sensor by the protective layer 5.

According to the integrated structure of the present invention, the signals of the MEMS microphone and the MEMS environmental sensor may be drawn out by the traditional lead structure so as to be connected with the terminals. Of course, the signals inside the structure may also be led to the outside of the whole integrated structure by means of depositing and etching the conductive layer, which is the common knowledge for those skilled in the art and will not be described in detail herein.

Figure 2:
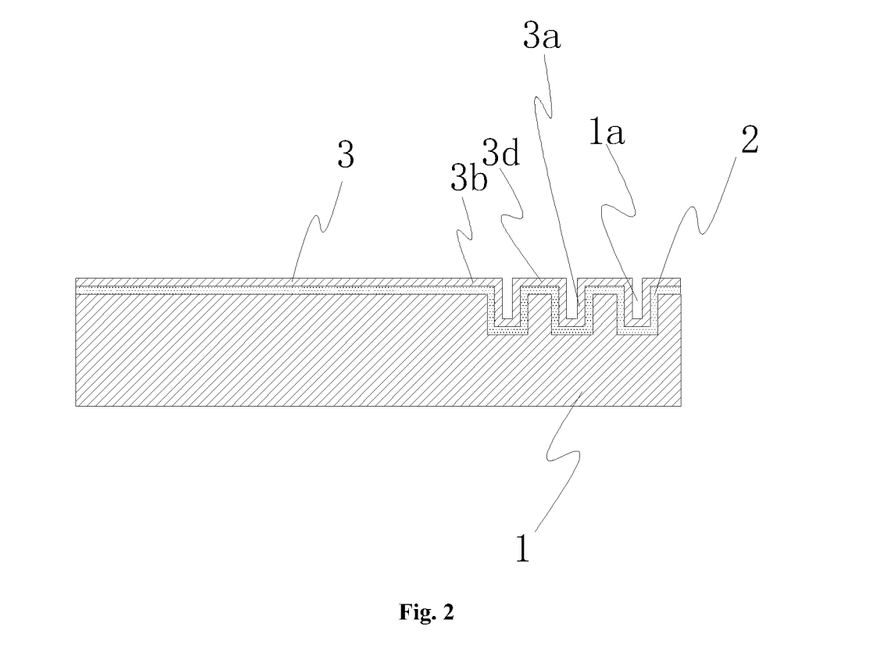
FIGS. 2-8 are process flowcharts of a manufacturing method for the integrated structure of the present invention.

The invention further provides a manufacturing method for an integrated structure of a MEMS microphone and an environmental sensor, which includes the following steps.

a) Firstly, a plurality of grooves 1a is etched in the upper end surface of a base material 1, and a first sacrificial layer 2 and a first film layer 3 are sequentially deposited on the upper end surface of the base material 1 and the inner wall of the groove 1a, referring to FIG. 2. The base material 1 may be made of a monocrystalline silicon material, and the shape of the groove 1a of the base material 1 is selected according to actual needs. For example, a U-shaped groove structure, an arc groove structure, or the like is adopted. The first sacrificial layer 2 and the first film layer 3 are sequentially deposited on the upper end surface of the whole base material 1, and the shapes of the first sacrificial layer 2 and the first film 3 are matched with the shape of the whole upper end of the base material 1.

The first film layer 3 includes the vibrating diaphragm of the MEMS microphone and the sensitive electrode of the MEMS environment sensor. In the subsequent process, the two need to be separated from each other. The sensitive electrode of the MEMS environment sensor includes a fixed part 3b fixed on the end surface of the base material 1 by the first sacrificial layer 2, and a bending part 3a extending into the groove 1a. The shape of the bending part 3a may be matched with the shape of the groove 1a. For example, when the groove 1a is a U-shaped structure, the bending part 3a may be a U-shaped groove structure conforming to the shape of the groove 1a, or may also be an arc groove structure, or the like.

When a plurality of grooves 1a is provided on the base material 1, the sensitive electrode of the MEMS environmental sensor further includes a connecting part 3d connected to two adjacent bending parts 3a, referring to FIGS. 1 and 2.

It should be noted here that the sacrificial layer may be made of a material well known to those skilled in the art, such as silicon oxide. The sacrificial layer may also be used as an insulating layer to ensure insulation among the parts. For example, in above step a), the first sacrificial layer 2 may be used as an insulating layer to ensure the insulation between the first film layer 3 and the base material 1, which is the common knowledge for those skilled in the art and will not be described in detail herein.

b) The first film layer 3 located in the vicinity of the groove 1a is etched to form a hollow 3c located in the vicinity of the groove 1a, and the first sacrificial layer 2 between the bending part 3a and the side wall of the groove 1a is at least corroded through the hollow 3c, referring to FIG. 3. The first sacrificial layer 2 may be corroded by hydrofluoric acid, which is the common knowledge for those skilled in the art and will not be described in detail herein.

When a plurality of grooves 1a is disposed, the hollow 3c is disposed at the position where the connecting part 3d is located. It should be noted here that the hollow 3c may be used as a corrosion hole to corrode the first sacrificial layer 2; and two adjacent bending parts 3a may be isolated from each other by the hollow 3c according to actual design needs. For example, when it is required to form a plurality of groups of capacitor structures of the MEMS environmental sensor on the base material 1, that is to say, when some adjacent bending parts 3a need to be insulated from each other, the hollow 3c may be disposed to penetrate the two ends of the connecting part 3d, thereby disconnecting the two adjacent bending parts 3a completely.

In a specific embodiment of the present invention, the first sacrificial layer 2 between the bending part 3a and the side wall of the groove 1a is corroded through the hollow 3c, and the first sacrificial layer 2 between the bending part 3a and the bottom end of the groove 1a is left. That is to say, the bottom end of the bending part 3a is connected to the bottom end of the groove 1a by the first sacrificial layer 2. The side wall of the bending part 3a and the side wall of the groove 1a form the capacitor structure of the MEMS environmental sensor.

In another specific embodiment of the present invention, the first sacrificial layer 2 between the bending part 3a and the groove 1a is completely corroded through the hollow 3c, so that there is no any connection relationship between the bending part 3a and the groove 1a. That is to say, the bending part 3a of the sensitive electrode is suspended in the groove 1a of the base material 1. Therefore, the sensitivity of the bending part 3a is improved, which is advantageous to improve the detection precision of the capacitor structure.

Figure 4:
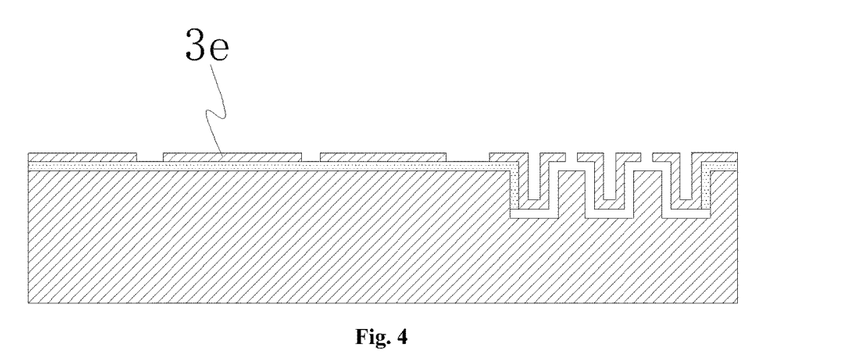
Figure 5:
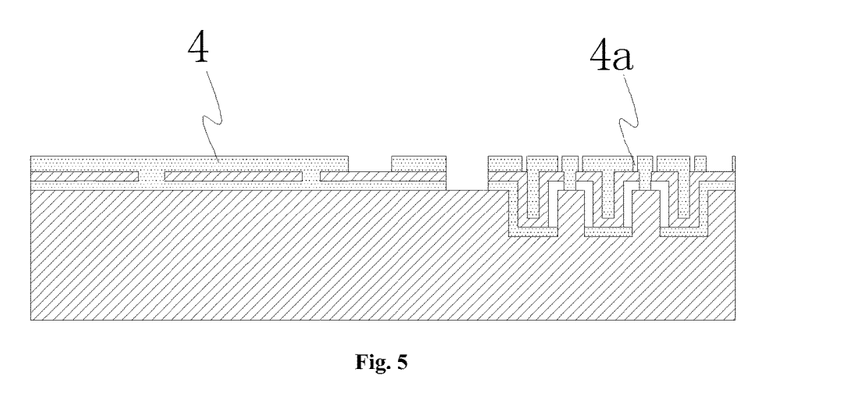
Figure 6:
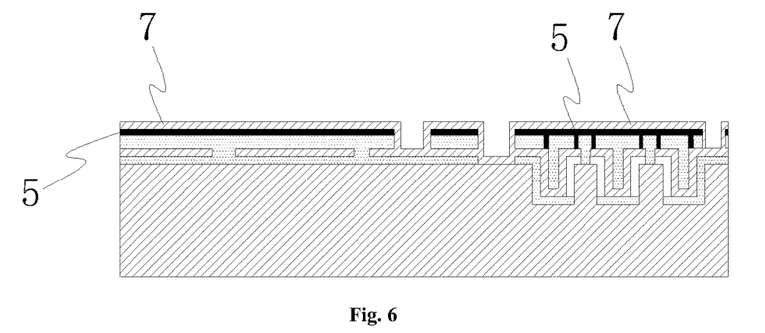

Preferably, the first sacrificial layer 2 below the connecting part 3d is also corroded by corroding, so that the connecting part 3d is suspended above the end surface of the base material 1. Therefore, the sensitivity of the bending part 3a connected with the connecting part 3d is improved, and the detection precision of the capacitor structure is further improved.

c) The first film layer 3 on the end surface of the base material 1 is etched to form the vibrating diaphragm 3e of the MEMS microphone, referring to FIG. 4; the positions on the first film layer 3 in the area where the MEMS microphone is located are pattern-etched to from the vibrating diaphragm 3e of the MEMS microphone. The vibrating diaphragm 3e adopts a structure well known to those skilled in the art, and the etching method and the etching pattern therefor are the common knowledge for those skilled in the art and will not be described in detail herein.

d) A second sacrificial layer 4 is deposited on the whole first film layer 3, referring to FIG. 5. The second sacrificial layer 4 is deposited on the vibrating diaphragm 3e of the MEMS microphone and the sensitive electrode of the MEMS environmental sensor. The hollow 3c etched in the above step is sealed by the second sacrificial layer.

e) A second film layer is deposited on the second sacrificial layer 4, and the second film layer is etched to form a back electrode 7 of the MEMS microphone, referring to FIG. 6. The second film layer is made of a polycrystalline silicon material, and may be deposited on the second sacrificial layer 4 in a manner well known to those skilled in the art, and be etched to form the back electrode 7 on the vibrating diaphragm 3e.

Figure 8:
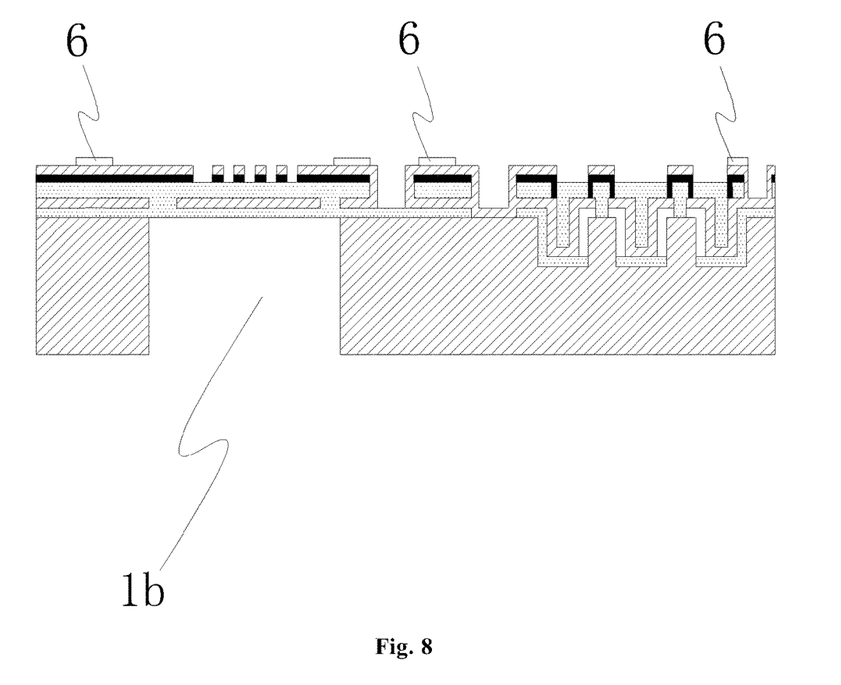

It should be noted here that the second film layer may cover to the area where the MEMS environmental sensor is located, and may be used as a drawn-out electrode or a shield layer of the MEMS environment sensor; and in the subsequent steps, the second film layer in the area where the MEMS environment sensor is located needs to be etched to expose the second sacrificial layer 4 on the bending part 3a for subsequent etching.

f) The base material 1 is etched to form the back cavity 1b of the MEMS microphone, referring to FIG. 8; and the base material 1 below the vibrating diaphragm 3e is etched to form the back cavity 1b below the vibrating diaphragm 3e. The structure of the back cavity 1b and the etching method therefor are the common knowledge for those skilled in the art and will not be described in detail herein.

g) The first sacrificial layer 2 and the second sacrificial layer 4 is corroded through the back cavity 1b to release the vibrating diaphragm 3e, and the second sacrificial layer 4 on the bending part 3a is etched to expose the bending part 3a, so that the bending part 3a can sense the change of the outside environmental, and the integrated structure of the present invention is finally formed, referring to FIG. 1.

The vibrating diaphragm 3e of the MEMS microphone is released by etching the first sacrificial layer 2 and the second sacrificial layer 4, so that the vibrating diaphragm 3e and the back electrode 7 form the capacitor structure of the MEMS microphone. The second sacrificial layer 4 on the bending part 3a is etched so as to expose the bending part 3a to the outside world, so that the bending part 3a can sense the change of the outside environmental, and forms the capacitor structure of the MEMS environmental sensor together with the side wall of the groove 1a of the base material.

The integrated structure of the present invention and the manufacturing method therefor further include a housing (not shown) for packaging, the housing may be fixed on the base material 1, and may package the capacitor structure of the MEMS microphone and that of the MEMS environment sensor. Accordingly, a sound hole of the MEMS microphone and a communication hole connecting the bending part of the MEMS environment sensor and the outside world should also be provided, which is common knowledge for those skilled in the art and will not be described in detail herein.

Figure 7:
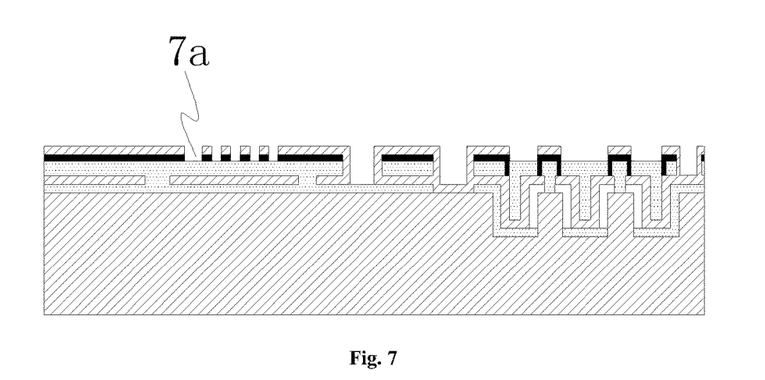

In a preferred embodiment of the present invention, in step d), the manufacturing method further includes the following step: etching the positions on the second sacrificial layer 4 on both sides of the hollow 3c to form a side wall groove 4a, referring to FIG. 5, depositing a protective layer 5 on the upper end of the second sacrificial layer 4, wherein the protective layer 5 is filled in the side wall groove 4a; and then pattern-etching the protective layer 5, referring to FIGS. 6 and 7. The protective layer 5 may be made of a silicon nitride material, and may be disposed in the position where the hollow is located by means of deposition, etching or the like, which is well known to those skilled in the art.

In another preferred embodiment of the present invention, between the step e) and the step f), the manufacturing method further includes a step of etching the second film layer on the bending part 3a, and a step of etching the back electrode 7 to form the airflow communication hole 7a.

As described above, the second film layer above the bending part 3a is etched so as to expose the second sacrificial layer 4 on the bending part 3a, so that the second sacrificial layer 4 at this position may be etched subsequently so as to expose the bending part 3a.

The back electrode 7 is etched to form an airflow communication hole 7a, and it is the common knowledge for those skilled in the art that the airflow communication hole is provided on the back electrode 7, the function of which will not be described in detail herein.

It is further preferable in the present invention that in the step f), the manufacturing method further includes a step of depositing a metal electrode 6 on the base material 1, the back electrode 7 and the vibrating diaphragm 3e. The metal electrode 6 may be used as a solder joint for a capacitor lead, so as to draw out the signals of each of the capacitor structures, referring to FIG. 8. With respect to the integrated structure as shown in FIG. 1, the electrodes of the base material 1, the vibrating diaphragm 3e and the bending part 3a may be drawn out by selectively etching the first sacrificial layer 2 and the second sacrificial layer 4 and by depositing and etching the second film layer, which is the common knowledge for those skilled in the art and will not be described in detail herein. Although specific embodiments of the present invention are described in detail through some examples, those skilled in the art shall understand that the above examples are illustrative only and are not intended to limit the scope of the present invention, that modifications can be made to the above embodiments without departing from the scope and spirit of the present invention, and that the scope of the present invention is defined by the appended claims.

The invention claimed is:

1. An integrated structure of an MEMS microphone and an environmental sensor, comprising:
   a base material (1), wherein:
      the base material (1) is provided with a vibrating diaphragm (3e) and a back electrode (7) which form a capacitor structure of the MEMS microphone, and a back cavity (1b) is provided at a position of the base material (1) below the vibrating diaphragm (3e) and the back electrode (7), and
      the upper end of the base material (1) is further provided with at least one groove (1a); and
   a sensitive electrode on the base material (1), wherein:
      the sensitive electrode comprises a fixed part (3b) fixed on the end surface of the base material (1) through a first sacrificial layer (2), and a bending part (3a) extending into the groove (1a),
      the bending part (3a) and the side wall of the groove (1a) form a capacitor structure of the MEMS environment sensor, and
      the bending part (3a), the fixed part (3b) and the groove (1a) form an airtight cavity.

2. The environmental sensor according to claim 1, wherein the bending part (3a) is suspended in the groove (1a).

3. The environmental sensor according to claim 1, wherein the bottom end of the bending part (3a) is fixed on the bottom end of the groove (1a) through the sacrificial layer.

4. The environmental sensor according to claim 1, wherein the sensitive electrode further comprises a connecting part (3d) connected to two adjacent bending parts (3a), and the connecting part (3d) is suspended above the end surface of the base material (1).

5. The environmental sensor according to claim 4, wherein the connecting part (3d) is further provided with a hollow (3c), and the two adjacent bending parts (3a) are insulated by the hollow (3c); and the environmental sensor further comprises a second sacrificial layer (4) filling the hollow (3c).

6. A manufacturing method for an integrated structure of an MEMS microphone and an environmental sensor, comprising:
   a) etching a groove (1a) in the upper end surface of the base material (1), and sequentially depositing a first sacrificial layer (2) and a first film layer (3) on the upper end surface of the base material (1) and the inner wall of the groove (1a), wherein the first film layer (3) comprises a fixed part (3b) fixed on the end surface of the base material (1), and a bending part (3a) extending into the groove (1a);
   b) etching the first film layer (3) located in the vicinity of the groove (1a) to form a hollow (3c), and at least corroding the first sacrificial layer (2) located between the bending part (3a) and the side wall of the groove (1a) through the hollow (3c);
   c) etching the first film layer (3) on the end surface of the base material (1) to form a vibrating diaphragm (3e) of the MEMS microphone;
   d) depositing a second sacrificial layer (4) on the whole first film layer (3), wherein the second sacrificial layer (4) seals the hollow (3c);

e) depositing a second film layer on the second sacrificial layer (4), and etching the second film layer to form a back electrode (7) of the MEMS microphone;

f) etching the base material (1) to form a back cavity (1b) of the MEMS microphone; and g) corroding the first sacrificial layer and the second sacrificial layer through the back cavity (1b) to release the vibrating diaphragm (3e); and corroding the second sacrificial layer (4) on the bending part (3a) to expose the bending part (3a).

7. The manufacturing method according to claim 6, wherein in the step b), the first sacrificial layer (2) between the bending part (3a) and the groove (1a) is completely corroded, so that the bending part (3a) is suspended in the groove (1a).

8. The manufacturing method according to claim 6, wherein the step d) further comprises etching the positions on the second sacrificial layer (4) on both sides of the hollow (3c) to form a side wall groove (4a), and depositing a protective layer (5) on the upper end of the second sacrificial layer (4), wherein the protective layer (5) is filled in the side wall groove (4a).

9. The manufacturing method according to claim 8, wherein between the step e) and the step f), the method further comprises etching the second film layer on the bending part (3a), and a step of etching the back electrode (7) to form an airflow communication hole (7a).

10. The manufacturing method according to claim 6, wherein the step f) further comprises depositing a metal electrode (6) on the back electrode (7), the base material (1), the vibrating diaphragm (3e) and the bending part (3a).

* * * * *